US011296685B2

(12) United States Patent
Zanbaghi et al.

(10) Patent No.: US 11,296,685 B2
(45) Date of Patent: Apr. 5, 2022

(54) PWM MODULATOR HAVING QUANTIZER CALIBRATABLE FOR MULTI-NON-IDEAL GAIN-AFFECTING CHARACTERISTICS

(71) Applicant: Cirrus Logic International Semiconductor Ltd., Edinburgh (GB)

(72) Inventors: Ramin Zanbaghi, Austin, TX (US); Anuradha Parsi, Austin, TX (US); Kyehyung Lee, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/996,779

(22) Filed: Aug. 18, 2020

(65) Prior Publication Data

US 2021/0044285 A1 Feb. 11, 2021

Related U.S. Application Data

(60) Division of application No. 16/163,766, filed on Oct. 18, 2018, now Pat. No. 10,819,328, which is a
(Continued)

(51) Int. Cl.
*H03K 7/08* (2006.01)
*H03K 4/06* (2006.01)
(Continued)

(52) U.S. Cl.
CPC ............. *H03K 7/08* (2013.01); *H03F 3/185* (2013.01); *H03F 3/217* (2013.01); *H03F 3/2171* (2013.01);
(Continued)

(58) Field of Classification Search
CPC ...................................................... H03K 7/08
See application file for complete search history.

(56) References Cited

U.S. PATENT DOCUMENTS

| 5,559,467 A | 9/1996 | Smedley |
| 5,719,528 A * | 2/1998 | Rasmussen ............. H02J 7/345 |
| | | 330/10 |

(Continued)

FOREIGN PATENT DOCUMENTS

| CN | 101192805 A | 6/2008 |
| CN | 206743199 U | 12/2017 |
| EP | 1788701 | 5/2007 |

OTHER PUBLICATIONS

Sasaki, Masaaki et al. "A Wide-Dynamic-Range CMOS Image Sensor Based on Multiple Short Exposure-Time Readout with Multiple-Resolution Column-Parallel ADS." IEEE Sensors Journal vol. 7, No. 1, Jan. 1, 2007 pp. 151-158.
(Continued)

*Primary Examiner* — Patricia T Nguyen
(74) *Attorney, Agent, or Firm* — E. Alan Davis; James W. Huffman

(57) ABSTRACT

A PWM modulator has a quantizer that generates a PWM output signal to speaker driver. When a first voltage swing range is supplied to the speaker driver, the quantizer analog gain is controlled to be a first gain value. When a second PWM drive voltage swing range is supplied to the speaker driver, the analog gain is controlled to be a second gain value. The first and second gain values of the analog gain of the quantizer cause the combined gain of the quantizer and driver to be approximately equal in the two modes. The quantizer has at least two gain-affecting measurable non-ideal characteristics. The quantizer is adjustable using measured first and second values to correct for first and second of the at least two non-ideal characteristics. The gain of the quantizer is calibratable while the quantizer is adjusted using the measured first and second measured values.

10 Claims, 14 Drawing Sheets

Related U.S. Application Data continuation of application No. 16/163,638, filed on Oct. 18, 2018, now Pat. No. 10,659,029.

(60) Provisional application No. 62/745,457, filed on Oct. 14, 2018.

(51) Int. Cl.
  *H03K 4/56* (2006.01)
  *H03F 3/217* (2006.01)
  *H03F 3/185* (2006.01)
  *H03M 3/00* (2006.01)

(52) U.S. Cl.
  CPC ............... *H03K 4/06* (2013.01); *H03K 4/066* (2013.01); *H03K 4/56* (2013.01); *H03M 3/422* (2013.01); *H03M 3/442* (2013.01); *H03M 3/484* (2013.01); H03F 2200/03 (2013.01); H03F 2200/331 (2013.01); H03F 2200/351 (2013.01)

(56) References Cited

U.S. PATENT DOCUMENTS

| | | |
|---|---|---|
| 6,404,251 B1 | 6/2002 | Dwelley et al. |
| 6,636,124 B1 | 10/2003 | Liu |
| 7,719,246 B2 | 5/2010 | Melanson |
| 10,067,478 B1 | 9/2018 | Kolar Ranganathan |
| 10,396,724 B1 | 8/2019 | Daigle et al. |
| 10,476,444 B1 | 11/2019 | Das et al. |
| 2004/0113671 A1* | 6/2004 | Anderson ............... H03K 7/08 327/172 |
| 2005/0162222 A1* | 7/2005 | Hezar ..................... H03F 3/217 330/10 |
| 2007/0024365 A1* | 2/2007 | Ramaswamy ............ H03F 1/34 330/251 |
| 2007/0279126 A1* | 12/2007 | Krishnan .............. H03F 3/2173 330/10 |
| 2011/0316626 A1* | 12/2011 | Komatsu ............... H03F 3/2173 330/207 A |
| 2018/0076806 A1 | 3/2018 | Yamauchi et al. |
| 2019/0379389 A1 | 12/2019 | Parupalli et al. |
| 2020/0119702 A1 | 4/2020 | Zanbaghi et al. |
| 2020/0119725 A1 | 4/2020 | Zanbaghi et al. |

OTHER PUBLICATIONS

Wittmann, Juergen et al. "A Configurable Sawtooth Based PWM Generator with 2 ns On-Time for >50 MHz DCDC Converters." 2015 11th Conference on PH.D. Research in Microelectronics and Electronics (PRIME), IEEE. Jun. 29, 2015, pp. 41-44.

\* cited by examiner

FIG. 5A
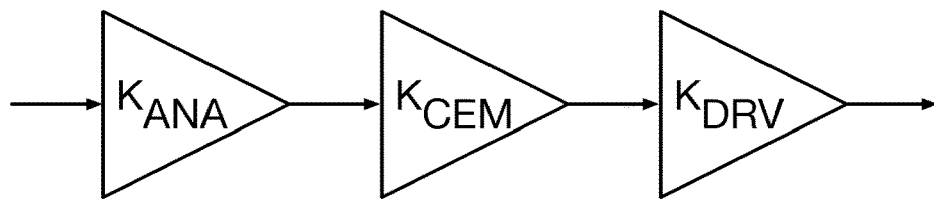
FIG. 5B
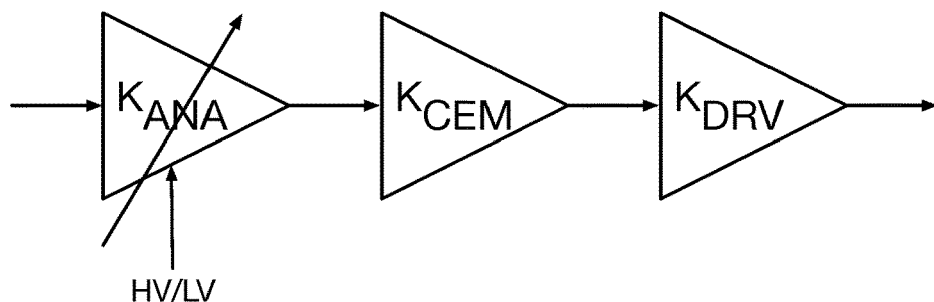
FIG. 6
| | HV | LV (conv.) | LV (emb. 1) | LV (emb. 2) |
|---|---|---|---|---|
| $V_{SPK}$ (V) | 12 | 4 | 4 | 4 |
| $V_{Ramp(fd)}$ (vpp) | 1.2 | 0.4 | 0.8 | 1.2 |
| $K_{DRV} = \dfrac{V_{SPK}}{V_{Ramp(fd)}}$ | 10 | 10 | 5 | 3.33 |
| $K_{ANA}$ | 0.5 | 0.5 | 1.0 | 1.33 |
| $K_{CEM}$ | 2 | 2 | 2 | 2 |
| $K_{TOTAL} = K_{ANA} * K_{DRV} * K_{CEM}$ | 10 | 10 | 10 | 10 |

$$V_{rampp} = V_{cm} + (I_{ref} / C_{ramp}) * t$$
$$V_{rampm} = V_{cm} - (I_{ref} / C_{ramp}) * t$$

$$V_{ramp}(t) = (V_{ref} / (R_{ref} * C_{ramp})) * t$$

PWM MODULATOR HAVING QUANTIZER CALIBRATABLE FOR MULTI-NON-IDEAL GAIN-AFFECTING CHARACTERISTICS

CROSS REFERENCE TO RELATED APPLICATION(S)

This application is a divisional of U.S. Non-Provisional Application, Ser. No. 16/163,766, filed Oct. 18, 2018, now U.S. Pat. No. 10,819,328, which is a continuation of U.S. Non-Provisional Application, Ser. No. 16/163,638, filed Oct. 18, 2018, now U.S. Pat. No. 10,659,029, both of which claim priority based on U.S. Provisional Application, Ser. No. 62/745,457, filed Oct. 14, 2018, entitled MULTI-NON-IDEAL GAIN-AFFECTING CHARACTERISTIC CALIBRATABLE PWM MODULATOR HAVING QUANTIZER WITH CONTROLLABLE ANALOG GAIN AND CHOPPED TRIANGULAR WAVE, each of which is hereby incorporated by reference in its entirety.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers. Typically, a pulse-width modulation (PWM) amplifier is chosen in order to provide accurate load voltage with desirable Total Harmonic Distortion (THD) and Power Supply Rejection Ratio (PSRR).

SUMMARY

In one embodiment, the present disclosure provides a closed loop pulse width modulation (PWM) modulator includes a speaker driver that selectively receives distinct first and second PWM drive voltage swing ranges and a quantizer having an analog gain and that generates a PWM output signal to the speaker driver. The quantizer and speaker driver have a combined gain. While operating in a first mode in which the first PWM drive voltage swing range is supplied to the speaker driver, the analog gain of the quantizer is controlled to be a first gain value. While operating in a second mode in which the second PWM drive voltage swing range is supplied to the speaker driver, the analog gain of the quantizer is controlled to be a second gain value distinct from the first gain value. The first and second gain values of the analog gain of the quantizer cause the combined gain of the quantizer and driver to be approximately equal in the first and second modes.

In one embodiment, the present disclosure provides a method that includes operations performed in a closed loop pulse width modulation (PWM) modulator including a speaker driver that selectively receives distinct first and second PWM drive voltage swing ranges and a quantizer having an analog gain and that generates a PWM output signal to the speaker driver, wherein the quantizer and speaker driver have a combined gain. The method includes controlling the analog gain of the quantizer to be a first gain value while operating in a first mode in which the first PWM drive voltage swing range is supplied to the speaker driver and controlling the analog gain of the quantizer to be a second gain value while operating in a second mode in which the second PWM drive voltage swing range is supplied to the speaker driver. The second gain value is distinct from the first gain value. The first and second gain values of the analog gain of the quantizer cause the combined gain of the quantizer and driver to be approximately equal in the first and second modes.

In one embodiment, the present disclosure provides a pulse width modulation (PWM) modulator includes a quantizer having a ramp generator and a comparator. The quantizer has a gain and at least two measurable non-ideal characteristics that affect the gain. The quantizer is adjustable using measured first and second values to correct for respective first and second of the at least two non-ideal characteristics. The gain of the quantizer is calibratable while the quantizer is adjusted using the measured first and second measured values.

In one embodiment, the present disclosure provides a method performed in a pulse width modulation (PWM) modulator including a quantizer having a ramp generator and a comparator, the quantizer having a gain and at least two non-ideal characteristics that affect the gain. The method includes measuring a first value of a first of the at least two non-ideal characteristics, measuring a second value of a second of the at least two non-ideal characteristics, adjusting the quantizer using the measured first and second values to correct for the first and second of the at least two non-ideal characteristics, and calibrating the gain of the quantizer while the quantizer is adjusted using the measured first and second measured values.

BRIEF DESCRIPTION OF THE DRAWINGS

FIG. 5A is a block diagram illustrating the composition of an example combined linear gain of a quantizer and speaker driver.

FIG. 5B is a block diagram illustrating the composition of an example combined linear gain of a quantizer and speaker driver in a quantizer having an adjustable analog gain capability.

FIG. 6 is a table describing example gains and gain-related parameters for different PWM modulator speaker voltage operating modes.

DETAILED DESCRIPTION

Figure 1:
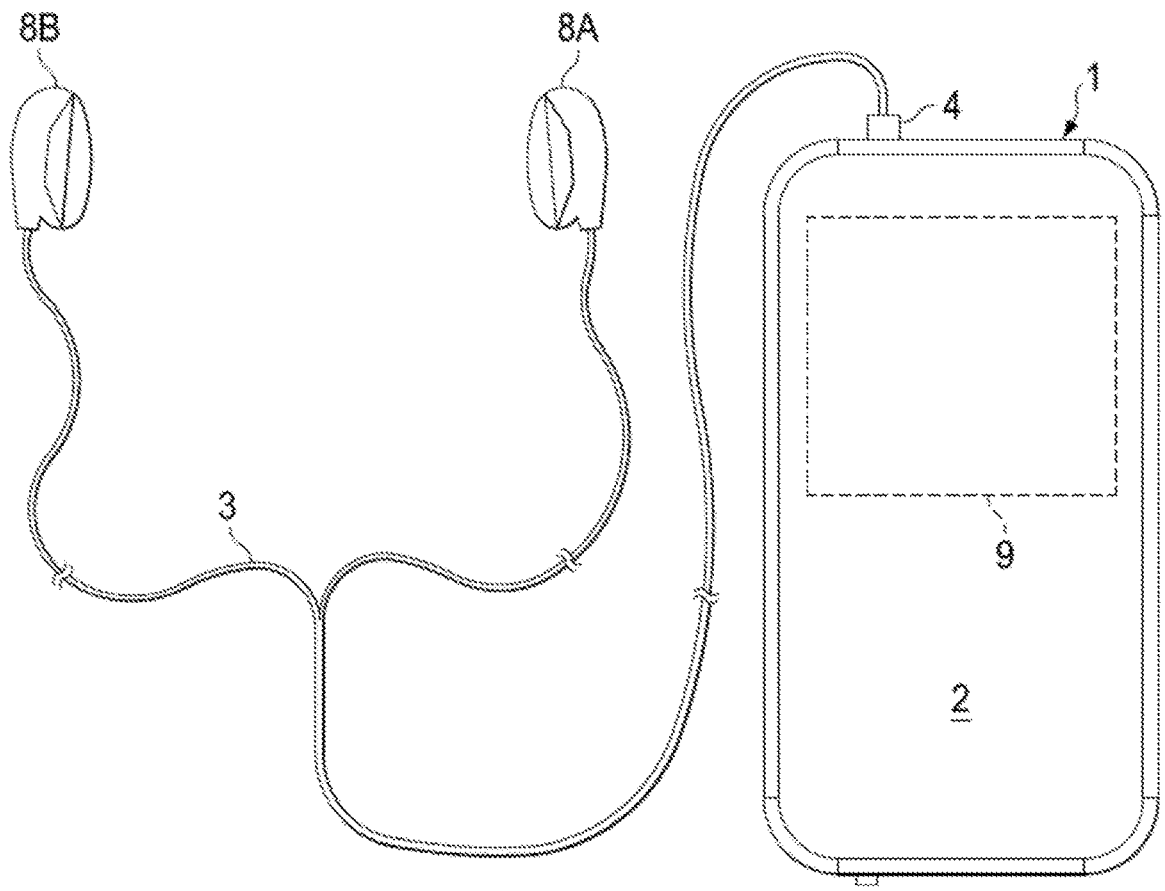
FIG. 1 is an illustration of an example personal audio device.

Referring now to FIG. 1, an illustration of an example personal audio device 1, in accordance with embodiments of the present disclosure is shown. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
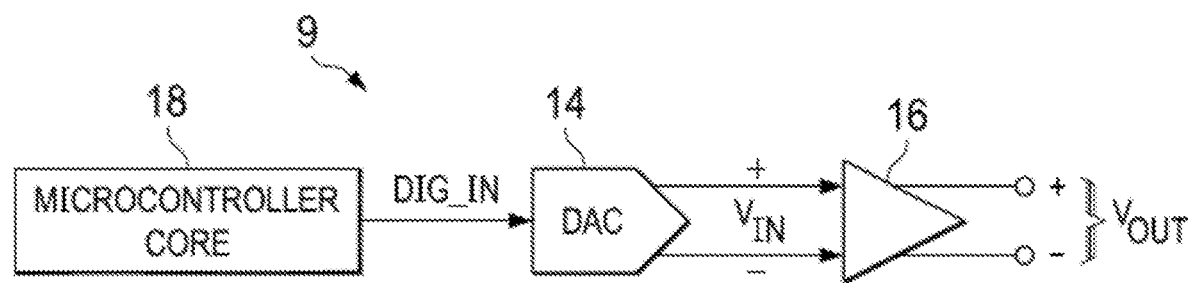
FIG. 2 is a block diagram of selected components of an example audio IC of a personal audio device.

Referring now to FIG. 2, a block diagram of selected components of an example audio IC 9 of a personal audio device, in accordance with embodiments of the present disclosure is shown. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
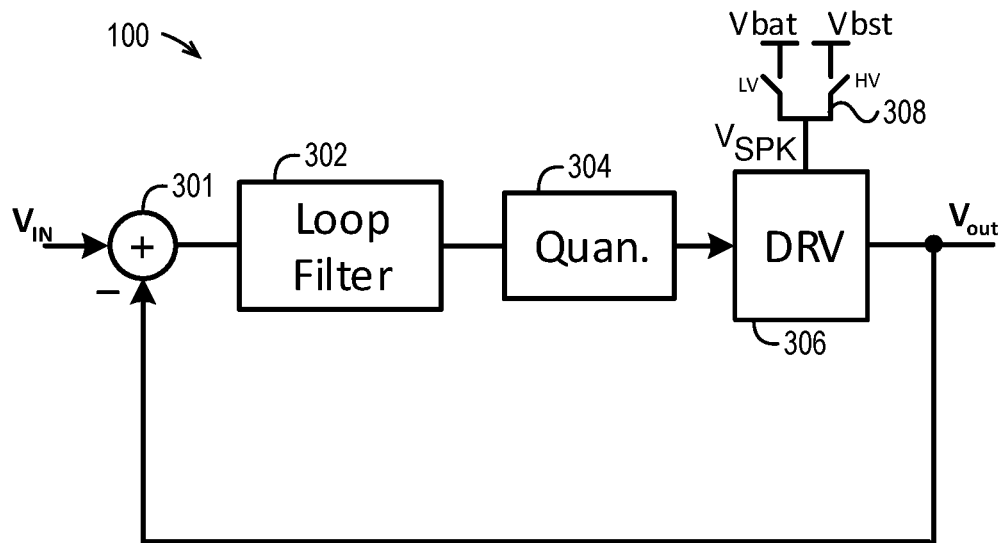
FIG. 3 is a block diagram illustrating an example class-D modulator based on a pulse-width modulation (PWM) signal.

Referring now to FIG. 3, a block diagram illustrating a class-D modulator 100 based on a pulse-width modulation (PWM) signal is shown. The class-D modulator 100 (e.g., included in amplifier 16 of FIG. 2) receives an input signal $V_{IN}$ (e.g., of FIG. 2) provided to a summing element 301, whose output is provided to a loop filter 302, whose output is provided to a quantizer 304, whose output is provided to a speaker driver 306. The output $V_{OUT}$ (e.g., of FIG. 2) of the speaker driver 306 is fed back to a negating input of the summing element 301 to form a closed loop. The speaker driver 306 is coupled to a switch 308 that provides a driver supply voltage $V_{SPK}$ to the speaker driver 306. The driver supply voltage $V_{SPK}$ may also be referred to as the drive voltage swing range. The switch 308 is controlled to select either a high-voltage (HV) supply $V_{BAT}$ (e.g., battery supply) or a low-voltage (LV) supply $V_{BST}$ (e.g., boosted battery supply) to provide as the driver supply voltage $V_{SPK}$, or drive voltage swing range $V_{SPK}$, to the speaker driver 306. In one embodiment, $V_{BST}$ is 12V for HV mode operation and $V_{BAT}$ is 4V for LV mode operation, although other embodiments are contemplated in which the values of $V_{BST}$ and $V_{BAT}$ are different. In one embodiment, the modulator 100 has HV and LV modes for the purpose of saving power.

In one embodiment, the class-D modulator 100 loop operates in the analog domain similar to a continuous-time delta-sigma analog-to-digital converter (ADC). Unlike a double-sampling ADC, which is based on pulse-density modulation (PDM), the class-D modulator 100 is based on PWM. The PWM quantizer 304 converts an analog signal into a PWM signal. The quantizer 304 and the speaker driver 306 have respective gain values. In particular, the gain of the speaker driver 306 is proportional to the driver supply voltage $V_{SPK}$ provided to the speaker driver 306.

Embodiments are described below in which the gain of the quantizer 304—more specifically an analog gain of the quantizer 304—is advantageously adjusted commensurate with a change in the speaker driver gain when the driver supply voltage $V_{SPK}$ changes in order to maintain a fixed combined gain of the quantizer 304 and speaker driver 306. As a result, a voltage range and associated ramp slope of a sawtooth waveform (compared with a signal input to generate a PWM output signal) generated by the quantizer 304 may advantageously be kept close and in some embodiments fixed. Embodiments are also described below in which the sawtooth waveform generator employs a chopping technique on an internally generated triangular wave to generate the sawtooth wave which results in reduced ramp capacitor reset times and swing voltages. Finally, embodiments of a calibration method are described in which multiple non-ideal characteristics (e.g., comparator time delay and offset, RC time constant of the ramp generator, etc.) of the quantizer 304 are measured and adjusted to improve the accuracy of the gain calibration of the quantizer 304.

Figure 4:
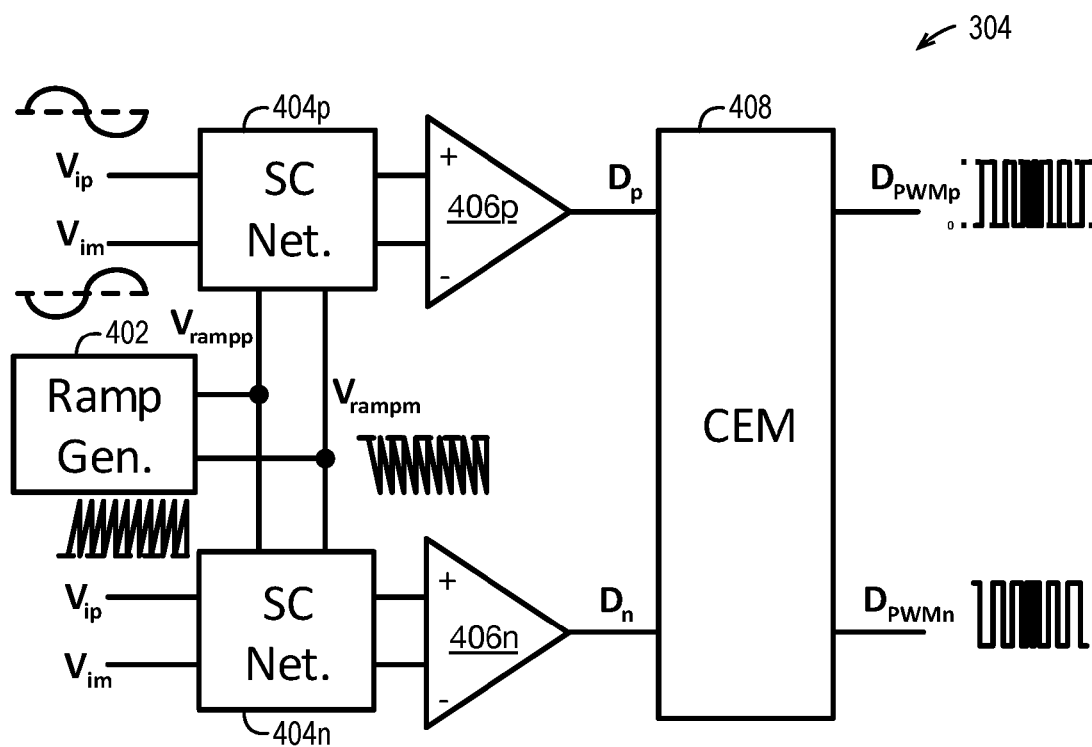
FIG. 4 is a block diagram illustrating in more detail the PWM quantizer of FIG. 3.

Referring now to FIG. 4, a block diagram illustrating in more detail the PWM quantizer 304 of FIG. 3 is shown. The PWM quantizer 304 includes a ramp generator 402 that generates a sawtooth wave-shaped ramp voltage $V_{ramp}$. In one embodiment, the ramp voltage $V_{ramp}$ is a differential voltage pair comprising a positive ramp voltage $V_{rampp}$ and negative ramp voltage $V_{rampm}$. The PWM quantizer 304 also includes a first switched-capacitor network ("SC Net.") 404p and a second switched-capacitor network ("SC Net.") 404n, each of which receives the positive and negative ramp voltages $V_{rampp}$ and $V_{rampm}$. The switched-capacitor network 404p/404n also receive a positive signal input voltage $V_{IP}$ and a negative signal input voltage $V_{IM}$. The switched-capacitor network 404p/404n operate on the ramp voltages $V_{rampp}$ and $V_{rampm}$ and the signal input voltages $V_{IP}$ and $V_{IM}$ to generate respective outputs provided to respective comparators 406p and 406n, which generate respective outputs $D_p$ and $D_n$ that are provided to a central edge modulation (CEM) block 408. The CEM block 408 generates a differential PWM output signal $D_{PWM}$ having a positive component denoted $D_{PWMp}$ and a negative component denoted $D_{PWMn}$ which are provided to the speaker driver 306 of FIG. 3. The switched-capacitor network 404p/404n according to one embodiment are described in more detail with respect to FIG. 7 below.

Referring now to FIG. 5A, a block diagram illustrating the composition of a combined linear gain $K_{TOTAL}$ of the quantizer 304 and driver 306 gain is shown. As shown, components that contribute to the combined linear gain $K_{TOTAL}$ include an analog gain $K_{ANA}$ of the quantizer 304 (e.g., of switched capacitor network 404), a gain $K_{DRV}$ of the speaker driver 306, and a gain $K_{CEM}$ of the CEM block 408, as shown in FIG. 5A and in equation (1) below. That is, the combined gain $K_{TOTAL}$ of the quantizer 304 and driver 306 may be defined from linear analysis of the modulator 100 system as proportional to a product of the analog gain $K_{ANA}$, the driver gain $K_{DRV}$, and the CEM gain $K_{CEM}$.

$$K_{TOTAL}=K_{ANA}*K_{DRV}*K_{CEM} \quad (1)$$

As shown in equation (2) below, the driver gain $K_{DRV}$ is the ratio of the speaker voltage $V_{SPK}$ and the ramp voltage swing range $V_{ramp(fd)}$. Thus, when the operating mode is transitioned from HV mode to LV mode (or vice versa), the driver gain $K_{DRV}$ will be changed (assuming the ramp voltage swing range $V_{ramp(fd)}$ is maintained), and a change in the driver gain $K_{DRV}$ changes the combined gain $K_{TOTAL}$. A change in the combined gain $K_{TOTAL}$ is undesirable because it changes the dynamics of the modulator 100 loop, e.g., changes the loop dynamics to be non-linear.

$$K_{DRV} = \frac{V_{SPK}}{V_{Ramp(fd)}} \quad (2)$$

One solution is to keep the driver gain $K_{DRV}$ fixed across mode changes in order to maintain a fixed combined gain $K_{TOTAL}$, which requires a change of the ramp voltage swing range $V_{ramp(fd)}$ to match the change in the speaker voltage $V_{SPK}$ in order to maintain the combined gain $K_{TOTAL}$ across the two modes, as may be observed from equation (3) which rearranges equation (2) to specify the ramp voltage swing range $V_{ramp(fd)}$ as the ratio of the speaker voltage $V_{SPK}$ and the speaker driver gain $K_{DRV}$.

$$V_{Ramp(fd)} = \frac{V_{SPK}}{K_{DRV}} \quad (3)$$

Per equations (4) below, in the example, it is assumed the analog gain $K_{ANA}$ is 0.5, the drive gain $K_{DRV}$ is 10, the CEM gain $K_{CEM}$ is 2, the total gain $K_{TOTAL}$ is 10, $V_{BST}$ is 12V for HV mode, and $V_{BAT}$ is 4V for LV mode. Consequently, as shown in equation (5), the ramp voltage swing range $V_{ramp(fd)}$ is 1.2 vpp in HV mode and 0.4 vpp in LV mode, which are summarized in the two left-most columns of the table of FIG. 6 denoted HV and LV (conv.).

$$\text{Assume } K_{ANA} = 0.5, K_{DRV} = 10, K_{CEM} = 2, \quad (4)$$
$$K_{TOTAL} = 10, V_{BST} = 12 \text{ V}, V_{BAT} = 4 \text{ V}$$

$$V_{Ramp(fd)} = \begin{cases} \dfrac{V_{BST}}{K_{DRV}} = \dfrac{12}{10} = 1.2 \; vpp(\text{HV mode}) \\ \dfrac{V_{BAT}}{K_{DRV}} = \dfrac{4}{10} = 0.4 \; vpp(\text{LV mode}) \end{cases} \quad (5)$$

However, such a large difference in the ramp voltage swing range $V_{ramp(fd)}$ between the HV and LV modes, 1.2 vpp to 0.4 vpp, i.e., a factor of 3, is also highly undesirable because it may introduce sensitivity in the system. More specifically, because circuits in the PWM modulator 100 that perform voltage to time conversion (e.g., comparators and summing networks), for example, operate based on the sawtooth ramp characteristics, it may be difficult to design such components to operate properly in the two different modes.

Embodiments are described that advantageously, while maintaining a fixed combined gain $K_{TOTAL}$, reduce the variation (or in some embodiments eliminate it) in the ramp voltage swing range $V_{ramp(fd)}$ and associated ramp slope between the two modes by adjusting the analog gain $K_{ANA}$ of the quantizer 304, as shown in FIG. 5B, to compensate for changes in the gain of the speaker driver 306 caused by a change of the speaker voltage $V_{SPK}$ values of the two modes.

Figure 7:
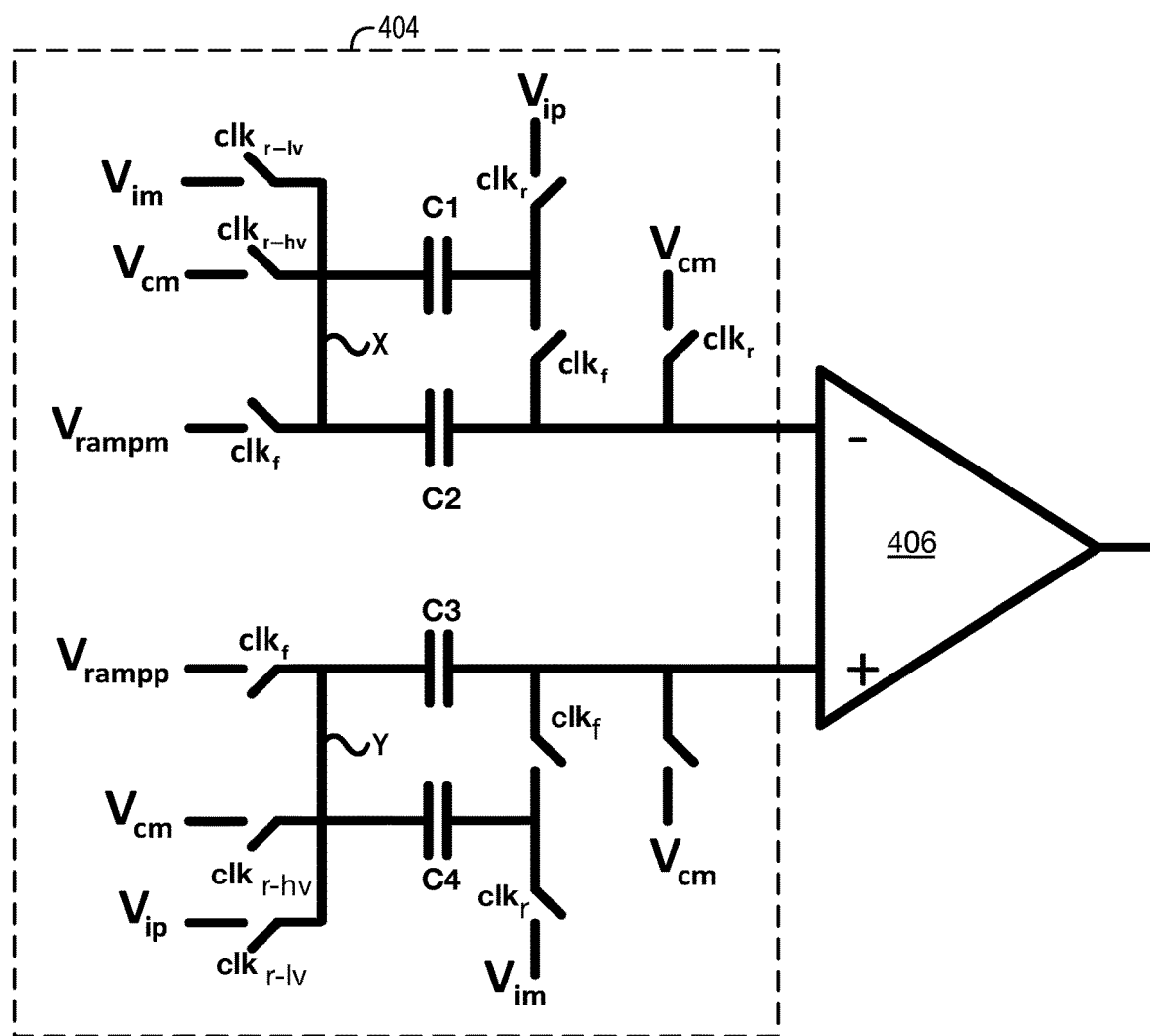
FIG. 7 is a block diagram illustrating an example embodiment of the quantizer of FIG. 3 that enables the analog gain $K_{ANA}$ to be adjusted in order to compensate for a change in the speaker voltage between operating modes.

Referring now to FIG. 7, a block diagram illustrating an embodiment of the quantizer 304 that enables the analog gain $K_{ANA}$ to be adjusted in order to compensate for a change in the speaker voltage $V_{SPK}$ between operating modes is shown. In the embodiment of FIG. 7, the sawtooth wave-shaped ramp voltage $V_{ramp}$ is coupled to the comparator 406 through a switched capacitor network 404 (e.g., switched capacitor network 404 of FIG. 4). The negative ramp voltage $V_{rampm}$ is coupled to the negative input of the comparator 406 through a switch controlled by a clock signal $CLK_f$ and then through a capacitor C2. The positive ramp voltage $V_{rampp}$ is coupled to the positive input of the comparator 406 through a switch controlled by clock signal $CLK_f$ and then through a capacitor C3. The node at the switch side of capacitor C2 is denoted node X, and the node at the switch side of capacitor C3 is denoted node Y. The other terminal of capacitor C2 is coupled to the negative ramp voltage $V_{rampm}$ through a switch controlled by a clock signal $CLK_r$, and the other terminal of capacitor C3 is coupled to the positive ramp voltage $V_{rampp}$ through a switch controlled by clock signal $CLK_r$. A common mode voltage $V_{cm}$ is also coupled to the positive and negative inputs of the comparator 406 through switches controlled by clock signal $CLK_r$.

The negative input to the comparator 406 is also coupled through a switch controlled by clock signal $CLK_f$ to a node that is coupled to a capacitor C1 and to positive signal input $V_{IP}$ through a switch controlled by clock signal $CLK_r$. The positive input to the comparator 406 is also coupled through a switch controlled by clock signal $CLK_f$ to a node that is coupled to a capacitor C4 and to negative signal input $V_{IM}$ through a switch controlled by clock signal $CLK_r$. The other terminal of capacitor C1 is coupled to node X, and the other terminal of capacitor C4 is coupled to node Y. Common mode voltage $V_{cm}$ is also coupled to node X and to node Y through switches controlled by a clock signal $CLK_{r-hv}$. Negative signal input $V_{IM}$ is coupled to node X through a switch controlled by a clock signal $CLK_{r-lv}$, and positive signal input $V_{IP}$ is coupled to node Y through a switch controlled by a clock signal $CLK_{r-lv}$.

Figure 8:
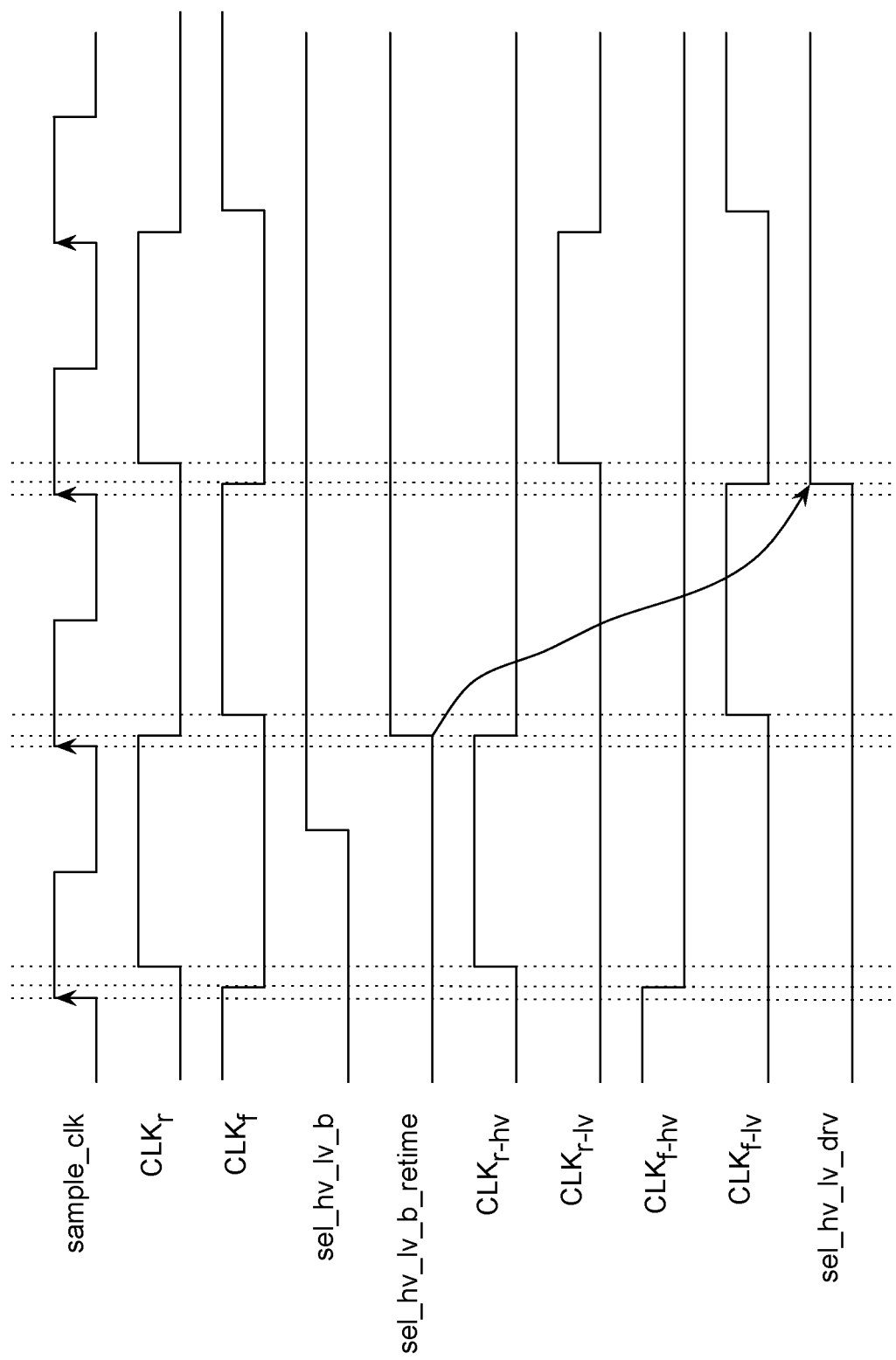
FIG. 8 is an example timing diagram that describes operation of the switched capacitor network of FIG. 7 to accomplish different analog gain values over different speaker voltage operating modes.

Operation of the switched capacitor network 404 of FIG. 7 is described by the timing diagram of FIG. 8 to accomplish an analog gain $K_{ANA}$ of the switched capacitor network 404 having a value of 0.5 when operating in HV mode and a value of 1.0 when operating in LV mode (assuming respective values of 12V and 4V for the speaker voltage $V_{SPK}$), as shown in the second-from-right column of the table of FIG. 6 denoted LV (emb. 1). Advantageously, controlling the respective analog gain $K_{ANA}$ values of 0.5 and 1.0 maintains a combined gain $K_{TOTAL}$ of 10 for both operating modes, as shown in the table of FIG. 6. That is, generally speaking, the analog gain $K_{ANA}$ has a gain value (first gain value) while operating in the HV mode (first mode) and a different gain value (second gain value) while operating in the LV mode (second mode), and the driver gain $K_{DRV}$ has a gain value (third gain value) while operating in the first mode and a different gain value (fourth gain value) while operating in the second mode, and the product of the first and third gain values is approximately the same as the product of the second and fourth gain values advantageously resulting in an approximately fixed combined gain $K_{TOTAL}$ across the two modes. Further advantageously, controlling the respective analog gain $K_{ANA}$ values of 0.5 and 1.0 accomplishes ramp voltage swing ranges $V_{ramp(fd)}$ of 1.2 vpp and 0.8 vpp, respectively, for the two modes, which represents a significant reduction in the variation of the ramp voltage swing range $V_{ramp(fd)}$ over a conventional solution that does not adjust the analog gain $K_{ANA}$. More specifically, as shown in the table of FIG. 6, the variation is advantageously reduced from a factor of 3 to a factor of 1.5.

In the embodiment of FIG. 7, the analog gain $K_{ANA}$ is adjustable by powers of two, yet the ratio of the speaker voltages $V_{SPK}$ may be non-powers of two, in which case the slope of the ramp voltage swing range $V_{ramp(fd)}$ may vary somewhat between the HV and LV modes; however, advantageously, the variation is significantly reduced with respect to a conventional amplifier not having the benefit of the variable analog gain $K_{ANA}$ embodiments, and the benefits described may still be realized by the variable analog gain $K_{ANA}$ embodiments. In other embodiments, the analog gain $K_{ANA}$ may be implemented to accomplish a non-power of two, as shown in the right-most column of the table of FIG. 6 denoted LV (emb. 2).

Advantageously, keeping the combined gain of the quantizer 304 and driver 306 close to the same or the same in both HV and LV mode avoids exacerbating non-idealities of the quantizer and exposing its design trade-offs and makes the modulator 100 loop behave similarly independent of the different speaker voltage values $V_{SPK}$.

Figure 9:
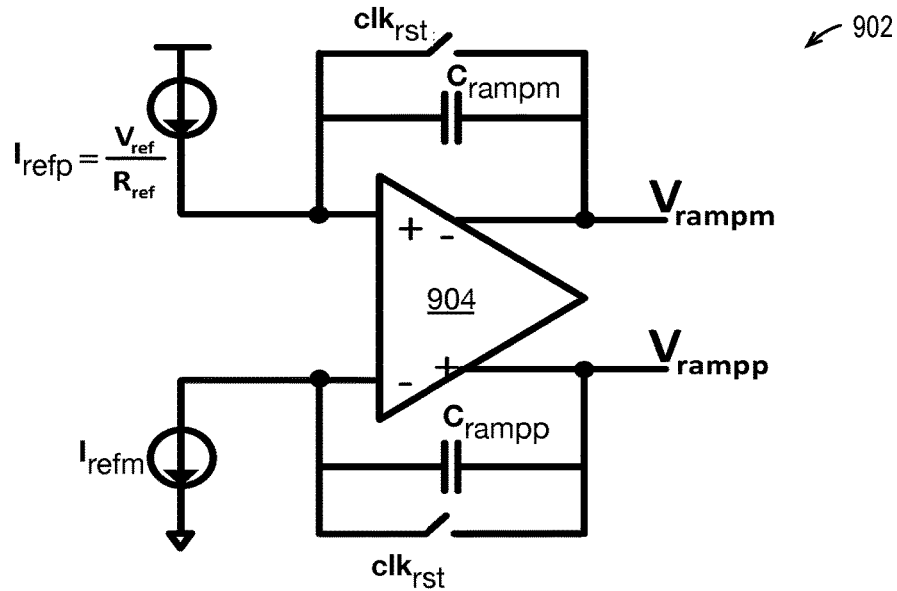
FIG. 9 is a block diagram of an example conventional ramp generator.
Figure 10:
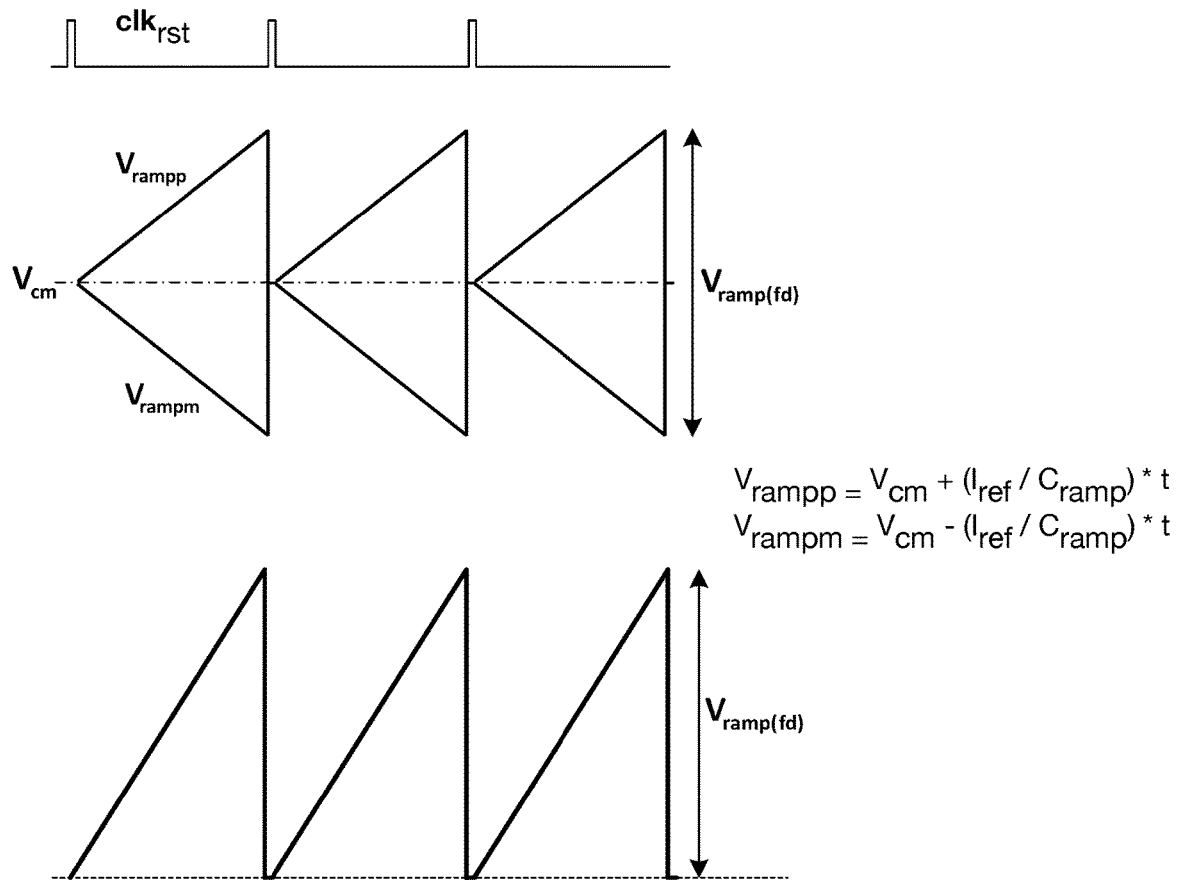
FIG. 10 is an example timing diagram illustrating operation of the ramp generator of FIG. 9.

Referring now to FIGS. 9 and 10, a prior art block diagram illustrating a portion of a ramp generator 902 used to generate a sawtooth wave and a timing diagram illustrating operation of the ramp generator 902, respectively, are shown. The ramp generator 902 includes an amplifier 904 having positive and negative inputs and positive and negative outputs. Coupled in parallel between the positive input and the negative output of the amplifier 904 are a first ramp capacitor $C_{rampm}$ and a first switch controlled by $CLK_{rst}$; additionally, coupled in parallel between the negative input and the positive output of the amplifier 904 are a second ramp capacitor $C_{rampp}$ and a second switch controlled by $CLK_{rst}$. When the switches are open (e.g., $CLK_{rst}$ is deasserted), two push-pull reference currents $I_{ref}$ (generated by current sources) are passing through the ramp capacitors $C_{rampm}$ and $C_{rampp}$ generating respectively negative and positive sloping ramp voltages $V_{rampm}$ and $V_{rampp}$ at the respective negative and positive outputs of the amplifier 904. The reference current $I_{ref}$ is the quotient of a reference voltage $V_{ref}$ and a reference resistance $R_{ref}$. Assertion of $CLK_{rst}$ causes energy stored in the ramp capacitors $C_{rampm}$ and $C_{rampp}$ to dissipate causing the ramp voltages $V_{rampm}$ and $V_{rampp}$ to be reset to a common mode voltage $V_{cm}$ before the next ramp cycle, resulting in a pair of complementary polarity sawtooth waves, as shown in FIG. 10. A resulting sawtooth wave is generated as the difference between the positive ramp voltage $V_{rampp}$ and the negative ramp voltage $V_{rampm}$. A ramp voltage swing range $V_{ramp(fd)}$ is shown as the difference between the maximum value of $V_{rampp}$ and the minimum value of $V_{rampm}$, which is also shown as the difference between the maximum value of the sawtooth wave and the common mode voltage $V_{cm}$.

A disadvantage of the prior art ramp generator 902 of FIGS. 9 and 10 that resets the sawtooth wave to the common mode voltage $V_{cm}$ is that it requires on each cycle a relatively wide reset time that is required to discharge the ramp capacitors $C_{rampm}$ and $C_{rampp}$, which may reduce the modulation index (MI) associated with a PWM modulator that employs the ramp generator 902. Another disadvantage is that it requires the ramp voltages to reach relatively high voltage swing values. Advantageously, embodiments of an improved ramp generator are described below that address these disadvantages.

Figure 11:
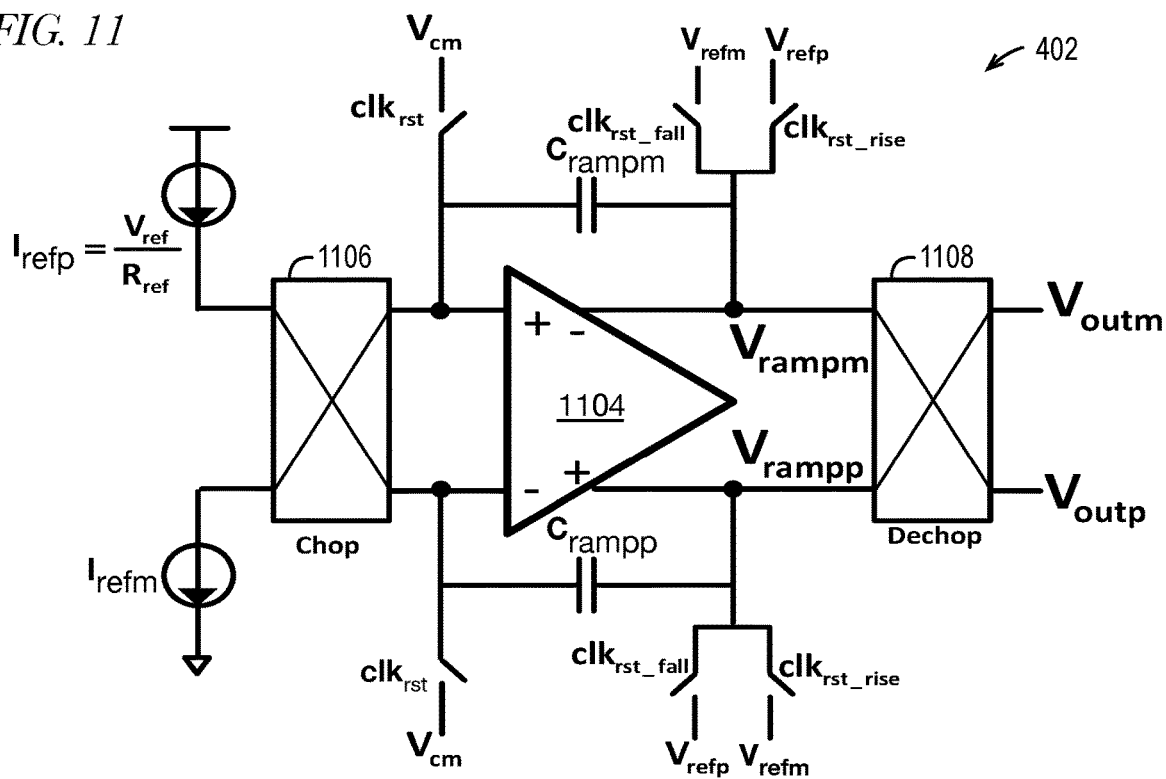
FIG. 11 is a block diagram illustrating an example portion of a ramp generator of FIG. 4 that employs a chopping technique to generate a triangular wave for use in a quantizer of FIG. 3 of a PWM modulator of FIG. 3.

Referring now to FIG. 11, a block diagram illustrating a portion of a ramp generator 402 (e.g., ramp generator 402 of FIG. 4) that employs a chopping technique to generate a triangular wave for use in a quantizer (e.g., quantizer 304 of FIG. 3) of a PWM modulator (e.g., PWM modulator 100 of FIG. 3) is shown. The ramp generator 402 includes an amplifier 1104 having positive and negative inputs and positive and negative outputs. Coupled between the positive input and the negative output of the amplifier 1104 is a ramp capacitor $C_{rampm}$ and coupled between the negative input and the positive output of the amplifier 1104 is a ramp capacitor $C_{rampp}$.

The ramp generator 402 also includes a chopping block 1106, or chopping switch 1106, whose first and second outputs are coupled to the positive and negative inputs of the amplifier 1104, respectively. The two inputs to the chopping switch 1106 are coupled to receive respective positive and negative reference currents $I_{refp}$ and $I_{refm}$. The positive reference current $I_{refp}$ is the quotient of positive reference voltage $V_{refp}$ and a reference resistance $R_{ref}$, and the negative reference current $I_{refm}$ is the quotient of negative reference voltage $V_{refm}$ and the reference resistance $R_{ref}$. The chopping switch 1106 operates as a crossbar switch that may be dynamically controlled to operate in either a pass-through configuration or a cross configuration. In the pass-through configuration, the chopping switch 1106 connects the positive reference current $I_{refp}$ to the positive input of the amplifier 1104 and the negative reference current $I_{refm}$ to the negative input of the amplifier 1104. In the cross configuration, the chopping switch 1106 connects the positive reference current $I_{refp}$ to the negative input of the amplifier 1104 and the negative reference current $I_{refm}$ to the positive input of the amplifier 1104. Depending upon the configuration of the chopping switch 1106, the reference currents $I_{refp}$ and $I_{refm}$ selectively push-pull through the ramp capacitors $C_{rampp}$ and $C_{rampm}$ to generate respective negative and positive ramp voltages $V_{rampm}$ and $V_{rampp}$ at the respective negative and positive outputs of the amplifier 1104, as described in more detail below.

A common mode voltage $V_{cm}$ is selectively coupled to the positive and negative inputs of the amplifier 1104 through switches controlled by a clock signal $CLK_{rst}$. The node holding the negative ramp voltage $V_{rampm}$ is selectively coupled to the negative reference voltage $V_{refm}$ through a switch controlled by a clock signal $CLK_{rst\_fall}$ and is selectively coupled to the positive reference voltage $V_{refp}$ through a switch controlled by a clock signal $CLK_{rst\_rise}$. The node holding the positive ramp voltage $V_{rampp}$ is selectively coupled to the negative reference voltage $V_{refm}$ through a switch controlled by the clock signal $CLK_{rst\_rise}$ and is selectively coupled to the positive reference voltage $V_{refp}$ through a switch controlled by the clock signal $CLK_{rst\_fall}$.

The ramp generator 402 also includes a de-chopping block 1108, or de-chopping switch 1108, whose first and second inputs are coupled to the negative and positive outputs of the amplifier 1104, respectively. The two outputs of the de-chopping switch 1108 are coupled to nodes that hold respective negative and positive output voltages $V_{outm}$ and $V_{outp}$ that may be provided to other portions of a quantizer (e.g., to switched capacitor network 404 for provision to comparator 406 of FIG. 4 of quantizer 304 of FIG. 3) for use in generating a PWM signal, e.g., for provision to a speaker driver (e.g., speaker driver 306 of FIG. 3) for driving a speaker for audio generation. The de-chopping switch 1108 operates as a crossbar switch that may be dynamically controlled to operate in either a pass-through configuration or a cross configuration, similar to the chopping switch 1106. In the pass-through configuration, the de-chopping switch 1108 connects the negative ramp voltage $V_{rampm}$ to the negative output voltage $V_{outm}$ node and the positive ramp voltage $V_{rampp}$ to the positive output voltage $V_{outp}$ node. In the cross configuration, the de-chopping switch 1108 connects the negative ramp voltage $V_{rampm}$ to the positive output voltage $V_{outp}$ node and the positive ramp voltage $V_{rampp}$ to the negative output voltage $V_{outm}$ node.

Figure 12:
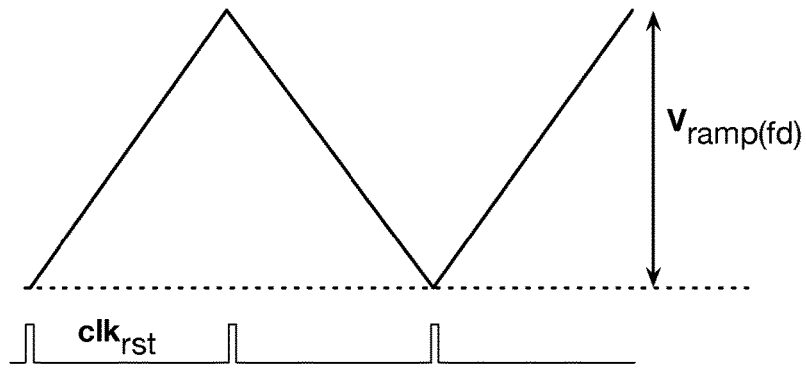
FIG. 12 is an example timing diagram illustrating operation of the ramp generator of FIG. 11.
Figure 12:
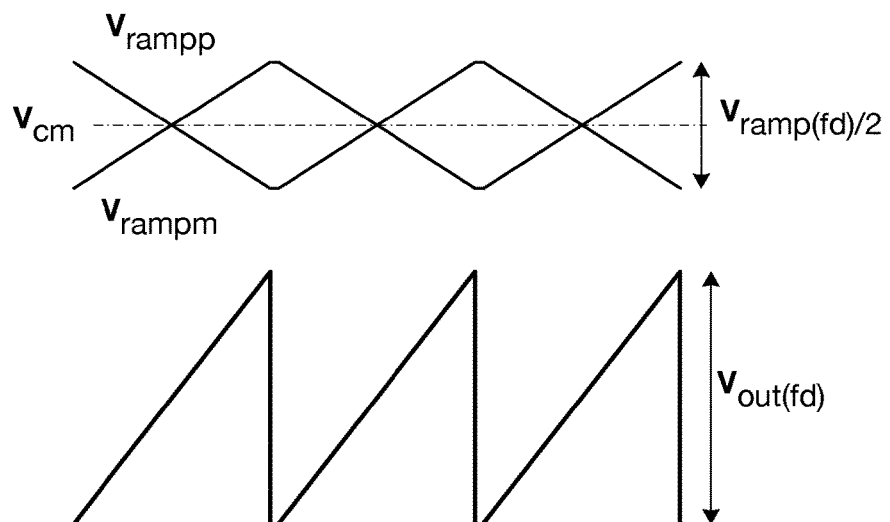

Referring now to FIG. 12, a timing diagram illustrating operation of the ramp generator 402 of FIG. 11 is shown. At the beginning of a first sampling period, $CLK_{rst}$ is asserted to close the switches to apply the common mode voltage $V_{cm}$ to the inputs of the amplifier 1104. Additionally, $CLK_{rst\_fall}$ is asserted to apply the negative reference voltage $V_{refm}$ to the node holding the negative ramp voltage $V_{rampm}$ and to apply the positive reference voltage $V_{refp}$ to the node holding the positive ramp voltage $V_{rampp}$. Still further, the chopping switch 1106 is controlled to be in the cross configuration to connect the positive reference current $I_{refp}$ to the negative input of the amplifier 1104 and to connect the negative reference current $I_{refm}$ to the positive input of the amplifier 1104. The chopping switch 1106 is maintained in the cross configuration through the sampling period to cause the voltage across ramp capacitor $C_{rampm}$ to increase which increases the negative ramp voltage $V_{rampm}$ from its negative peak (approximately $V_{cm}$ minus $V_{refm}$) to its positive peak (approximately $V_{cm}$ plus $V_{refp}$) and to cause the voltage across ramp capacitor $C_{rampp}$ to decrease which decreases the positive ramp voltage $V_{rampp}$ from its positive peak (approximately $V_{cm}$ plus $V_{refp}$) to its negative peak (approximately $V_{cm}$ minus $V_{refm}$), as shown. The result is a positively sloping ramp voltage $V_{ramp}$ (shown in FIG. 12 as a non-differential voltage $V_{rampm}$ minus $V_{rampp}$) having a swing of approximately the difference between the positive reference voltage $V_{refp}$ minus the negative reference voltage $V_{refm}$, referred to as $V_{ramp(fd)}$, which is a first period of what will become a triangular wave, as shown. Further during the first sampling period, the de-chopping switch 1108 is controlled to be in the pass-through configuration to cause the negative ramp voltage $V_{rampm}$ to be provided as the negative output voltage $V_{outm}$ and to cause the positive ramp voltage $V_{rampp}$ to be provided as the positive output voltage $V_{outp}$. The operation of the de-chopping switch 1108 in pass-through configuration results in the positively sloping ramp voltage $V_{ramp}$ of swing $V_{ramp(fd)}$ being passed through and provided on the output voltage $V_{OUT}$, which is a first period of what will become a sawtooth wave, as shown.

As will be understood from the following description, the ramp voltage $V_{ramp}$ is a negatively sloping ramp also having a swing of $V_{ramp(fd)}$ during the next sampling period, which will be polarity-inverted to form another positively sloping ramp of the sawtooth wave of the output voltage $V_{OUT}$. This pattern repeats for subsequent sampling period pairs, resulting in a triangular wave ramp voltage $V_{ramp}$, which is polarity-swapped on alternating periods (e.g., on periods in which the triangular wave ramp voltage $V_{ramp}$ is negatively sloping) by the de-chopping switch 1108 to form the sawtooth wave on the output voltage $V_{OUT}$, as shown. As a result, the ramp generator 402 advantageously enjoys the benefits perceived by smaller swings and reset times of the ramp capacitors, as described in more detail below.

In the next (second) sampling period, $CLK_{rst}$ is again asserted to apply the common mode voltage $V_{cm}$ to the inputs of the amplifier 1104. Additionally, $CLK_{rst\_rise}$ is asserted to apply the positive reference voltage $V_{refp}$ to the node holding the negative ramp voltage $V_{rampm}$ and to apply the negative reference voltage $V_{refm}$ to the node holding the positive ramp voltage $V_{rampp}$. This manner of operation has the advantage of resetting the respective ramp voltages to the relevant reference voltage in the event that the respective ramp voltages at their peak did not reach the relevant reference voltage during their run up/down, which may help avoid drift away from the relevant reference voltages. Still further, the chopping switch 1106 is controlled to be in the pass-through configuration to connect the positive reference current $I_{refp}$ to the positive input of the amplifier 1104 and to connect the negative reference current $I_{refm}$ to the negative input of the amplifier 1104. The chopping switch 1106 is maintained in the pass-through configuration through the second sampling period to cause the voltage across ramp capacitor $C_{rampm}$ to decrease which decreases the negative ramp voltage $V_{rampm}$ from its positive peak to its negative peak and to cause the voltage across ramp capacitor $C_{rampp}$ to increase which increases the positive ramp voltage $V_{rampp}$ from its negative peak to its positive peak, as shown. Further during the second sampling period, the de-chopping switch 1108 is controlled to be in the cross configuration to cause the negative ramp voltage $V_{rampm}$ to be provided as the positive output voltage $V_{outp}$ and to cause the positive ramp voltage $V_{rampp}$ to be provided as the negative output voltage $V_{outm}$. As shown in FIG. 12, a negatively sloping ramp voltage $V_{ramp}$ is provided to the de-chopping switch 1108 as a second period of a triangular wave having a swing of approximately $V_{ramp(fd)}$. Furthermore, operating in the cross configuration, the de-chopping switch 1108 polarity-inverts the received negatively sloping ramp voltage $V_{ramp}$ and provides the polarity-inverted version thereof as a positively sloping ramp having a swing of approximately $V_{ramp(fd)}$ on the output voltage $V_{OUT}$ as a second period of the sawtooth wave.

In the next (third) sampling period, as in the first sampling period, $CLK_{rst}$ is again asserted to apply the common mode voltage $V_{cm}$ to the inputs of the amplifier 1104, $CLK_{rst\_fall}$ is asserted to apply the negative reference voltage $V_{refm}$ to the node holding the negative ramp voltage $V_{rampm}$ and to apply the positive reference voltage $V_{refp}$ to the node holding the positive ramp voltage $V_{rampp}$ (advantageously resetting the respective ramp voltages to avoid drift away from the reference values), and the chopping switch 1106 is controlled to be in the cross configuration to connect the negative reference current $I_{refm}$ to the positive input of the amplifier 1104 and to connect the positive reference current $I_{refp}$ to the negative input of the amplifier 1104, which is maintained through the third sampling period to increase the negative ramp voltage $V_{rampm}$ from its negative peak to its positive peak and to decrease the positive ramp voltage $V_{rampp}$ from its positive peak to its negative peak, as shown. Further during the third sampling period, the de-chopping switch 1108 is controlled to be in the pass-through configuration to cause the positive ramp voltage $V_{rampp}$ to be provided as the positive output voltage $V_{outp}$ and to cause the negative ramp voltage $V_{rampm}$ to be provided as the negative output voltage $V_{outm}$. As shown in FIG. 12, a positively sloping ramp voltage $V_{ramp}$ of a third period of a triangular wave is provided to and passed through by the de-chopping switch 1108 to provide a positively sloping ramp having a swing of approximately $V_{ramp(fd)}$ on the output voltage $V_{OUT}$ as a third period of the sawtooth wave.

Figure 13:
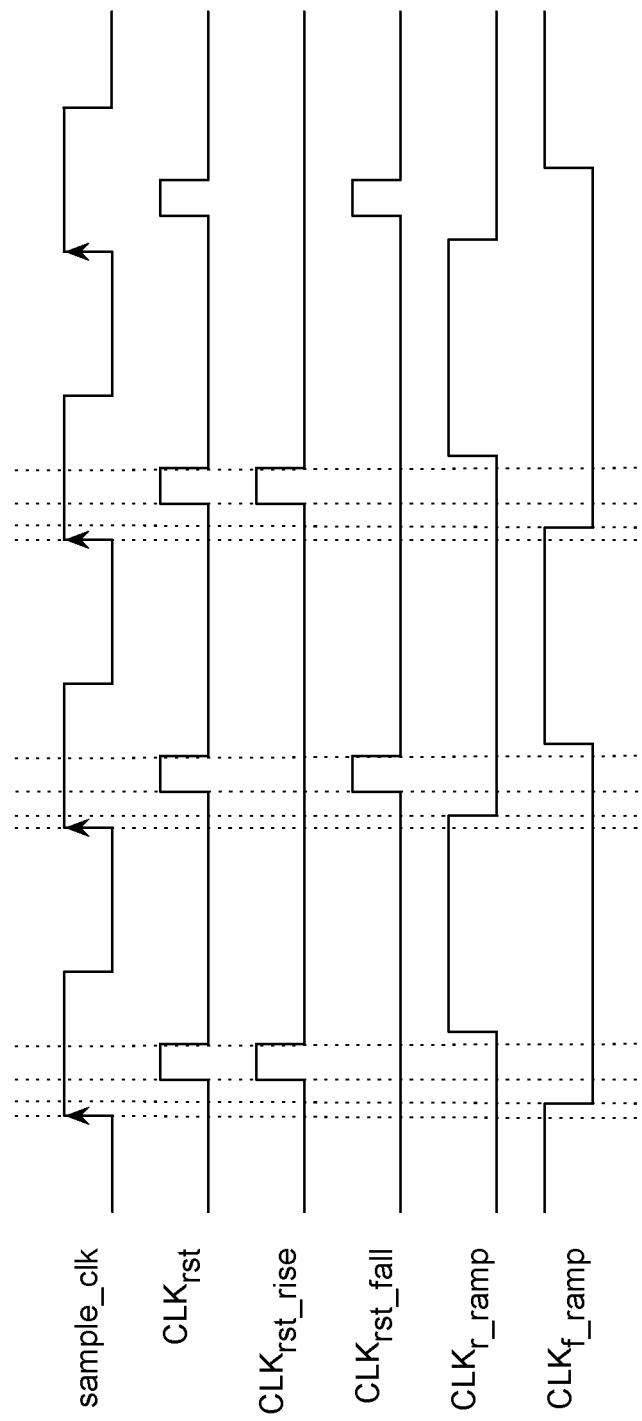
FIG. 13 is an example timing diagram describing operation of the switches of the ramp generator of FIG. 11 to accomplish the waveforms described with respect to FIG. 12.

The operation of the various switches of the ramp generator 402 of FIG. 11 to accomplish the waveforms described with respect to FIG. 12 is shown in the timing diagram of FIG. 13.

Advantages of the use of a chopping technique to convert a triangular wave, employed internal to the ramp generator 402, to produce a sawtooth wave may now be described. First, the purpose of the PWM modulator is to convert continuous voltage domain information into time domain information in which the time domain has a period T. A large reset time in the conventional ramp generator 902 of FIG. 9 (i.e., time required to reset the capacitors to the common mode voltage) reduces the usable portion of the period T, which may result in a loss of dynamic range, for example. In a lower voltage mode in which the duty cycle may need to be increased to provide sufficient pulse energy, the large reset time may particularly exacerbate operation since it may detrimentally affect the ability to increase the duty cycle, for example. Advantageously, embodiments have been described that reduce the reset time. Because in the embodiment of FIGS. 11 and 12, the ramp polarity is flipped, or inverted, at the end of each period, no sudden discharge of the ramp capacitors occurs and no large reset time is required. The reduced capacitor reset time regains the portion of the period lost by the conventional approach and may therefore improve the dynamic range of the PWM modulator 100. Second, due to the pre-charging of the ramp capacitors, the voltage swing of the ramp is reduced to approximately half the maximum voltage swing, as may be observed from FIG. 12. This voltage swing reduction may result in power savings especially for low voltage designs. Finally, as may be observed from FIG. 12, a sawtooth wave of swing $V_{ramp(fd)}$ ($V_{refp}$ minus $V_{refm}$) is provided on the output voltage $V_{OUT}$ of the ramp generator 402 similar to the sawtooth wave of FIG. 10, which advantageously enables reuse of various system elements (e.g., comparator 406 or the switched capacitor network 404) with the added benefits of reduced capacitor reset time and swing values as a result of the manner in which the ramp generator 402 produces a sawtooth wave from an internally-generated triangular wave.

In an alternate embodiment, the de-chopping switch 1108 provides a polarity-inverted version of the signal input $V_{IN}$ to the comparator 406 on alternating sampling periods, rather than a polarity-inverted version of the triangular wave, which may effectively accomplish a similar result.

Figure 14:
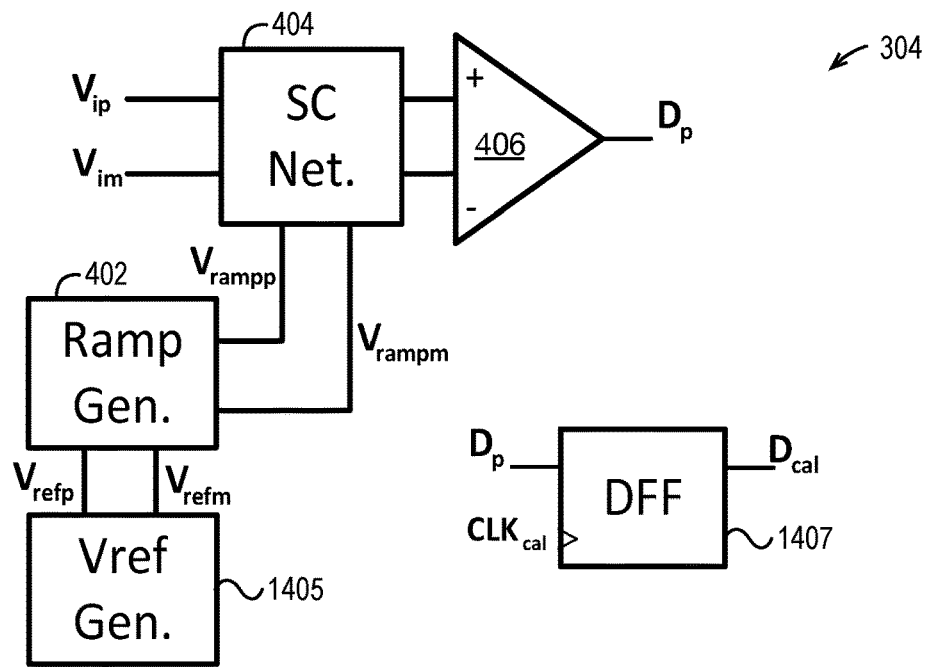
FIG. 14 is an example block diagram illustrating a system for calibrating a gain of the quantizer of FIG. 3.

Referring now to FIG. 14, a block diagram illustrating a system for calibrating a gain of a quantizer (e.g., quantizer 304 of FIG. 3) is shown. The system includes a ramp generator 402, switched capacitor network 404, and comparator 406 (e.g., of FIG. 4). The system also includes a D flip-flop 1407 and a voltage reference generator 1405 that provides the reference voltage $V_{refp}$ and $V_{refm}$ to the ramp generator 402. The ramp generator 402 provides the ramp voltage $V_{rampp}$ and $V_{rampm}$ to the switched capacitor network 404 which also receives the input signal $V_{IP}$ and $V_{IM}$. The comparator 406 outputs a value $D_P$ which is provided as the data input to the D flip-flop 1407. The output of the D flip-flop 1407 is value $D_{cal}$. The D flip-flop 1407 is clocked by a calibration clock $CLK_{cal}$.

Referring now to FIGS. 15A through 15E, timing diagrams illustrating aspects of gain calibration of the quantizer 304 of FIG. 14 are shown. Process, voltage, and temperature variations may change the characteristics of the operation of the quantizer 304, such as the characteristics of the ramp generated by the ramp generator 402. The changes may be due to changes in the characteristics of the reference resistance $R_{ref}$ and ramp capacitance $C_{ramp}$, for example. The ramp voltage as a function of time $V_{ramp}(t)$ is proportional to the ratio of the reference voltage $V_{ref}$ and the product of the reference resistance $R_{ref}$ and the ramp capacitance $C_{ramp}$, as shown in equation (6). Gain calibration is performed in order to capture the gain error in the time domain and correct the gain error.

$$V_{Ramp}(t) = \frac{V_{ref}}{R_{ref} * C_{ramp}} \qquad (6)$$

Figure 15A:
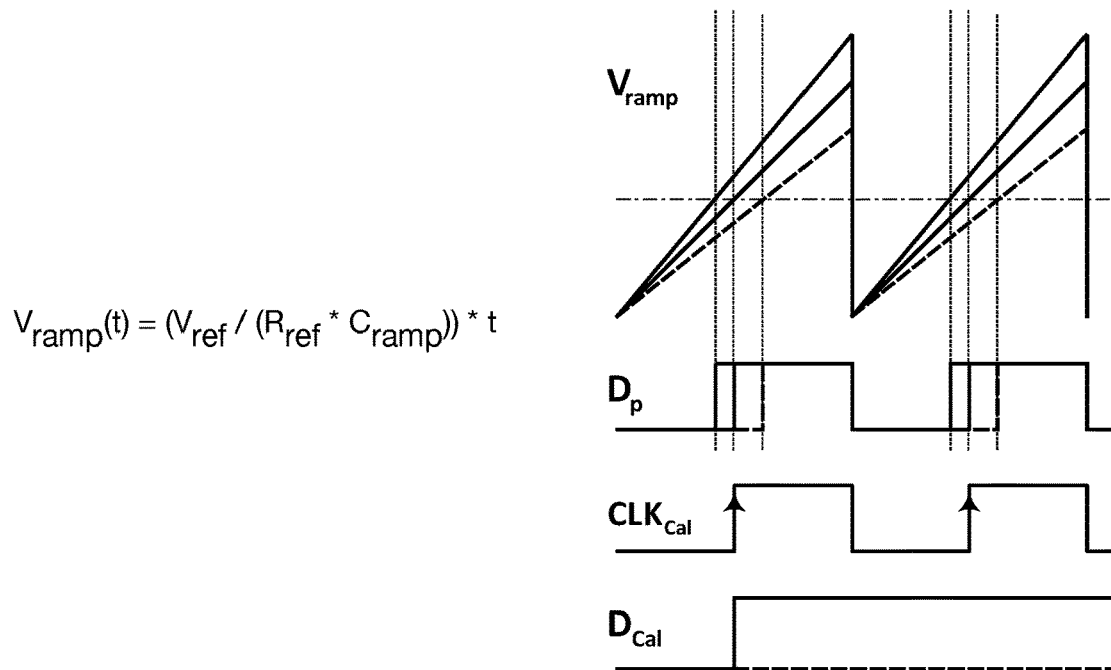
FIGS. 15A through 15E are example timing diagrams illustrating aspects of gain calibration of the quantizer of FIG. 14.

During calibration, the common mode voltage $V_{cm}$ is connected to the signal inputs, and the comparator 406 compares the ramp voltage $V_{ramp}$ to the common mode voltage $V_{cm}$. The calibration reference clock $CLK_{cal}$ causes the D flip-flop 1407 to latch the comparator 406 output $D_P$, as shown in FIG. 15A.

Figure 15B:
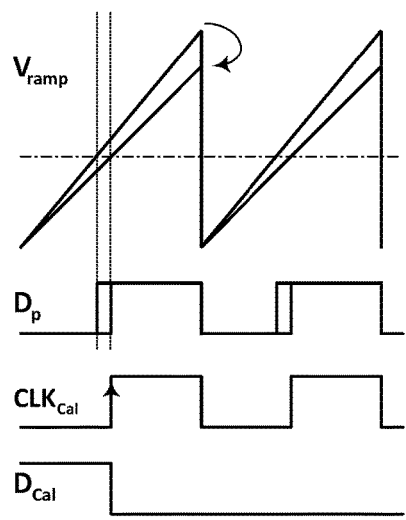
Figure 15C:
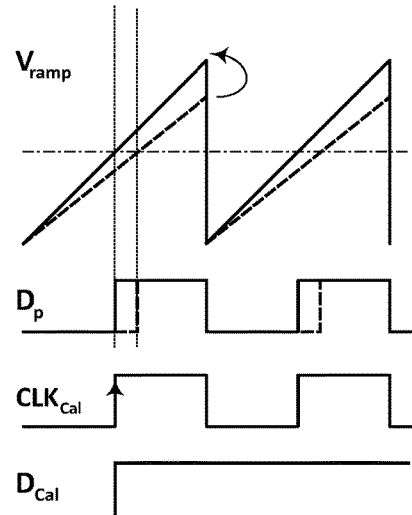
Figure 15D:
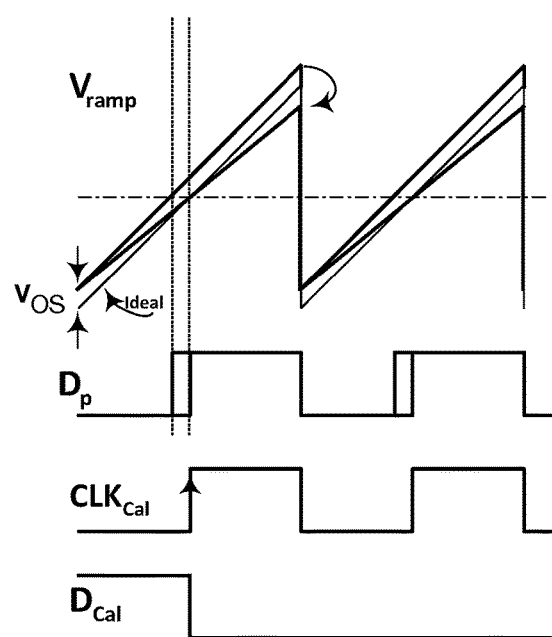

For an ideal ramp voltage $V_{ramp}$, the crossing occurs at the midpoint of the ramp. If the ramp slope is higher than normal (i.e., higher gain), a trim bit is changed in a step by step manner to reduce the slope of the ramp voltage $V_{ramp}$ until the polarity of $D_{cal}$ flips, as shown in FIG. 15B. Conversely, if the ramp slope is lower than normal (i.e., lower gain), the trim bit is changed in a step by step manner to increase the slope of the ramp voltage $V_{ramp}$ the until the polarity of $D_{cal}$ flips, as shown in FIG. 15C.

Various non-idealities may exist in the quantizer 304. For example, the comparator 406 may have an offset which creates an error term on the gain calibration. The gain calibration process only looks for the crossing and perceives the offset as a gain error even when the slope of the ramp voltage $V_{ramp}$ is correct. Adjusting to make the crossing mid-ramp creates an undesired gain error, shown in FIG. 15D as an offset voltage Vos.

Figure 15E:
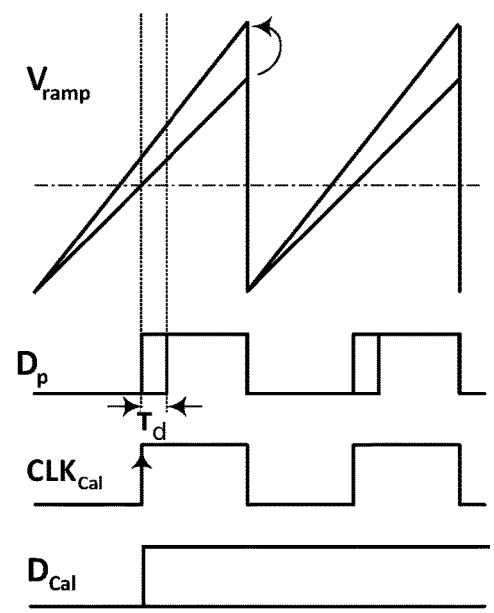

For another example, the comparator 406 may have a time delay $T_d$, shown in FIG. 15E, which creates an error term on the gain calibration. The gain calibration process may perceive the time delay $T_d$ as a gain error even when the slope of the ramp voltage $V_{ramp}$ is correct. More specifically, the delay error $T_d$ is treated like a voltage domain error. Adjusting to offset the time delay $T_d$ creates an undesired error in the slope of the ramp voltage $V_{ramp}$, as shown.

Advantageously, embodiments of an improved calibration process are now described that removes the comparator offset $V_{os}$, and compactor delay $T_d$ so that they do not create a gain error term which may advantageously result in a more accurate calibration of the gain of the quantizer 304, e.g., the ramp gain/slope.

Figure 16:
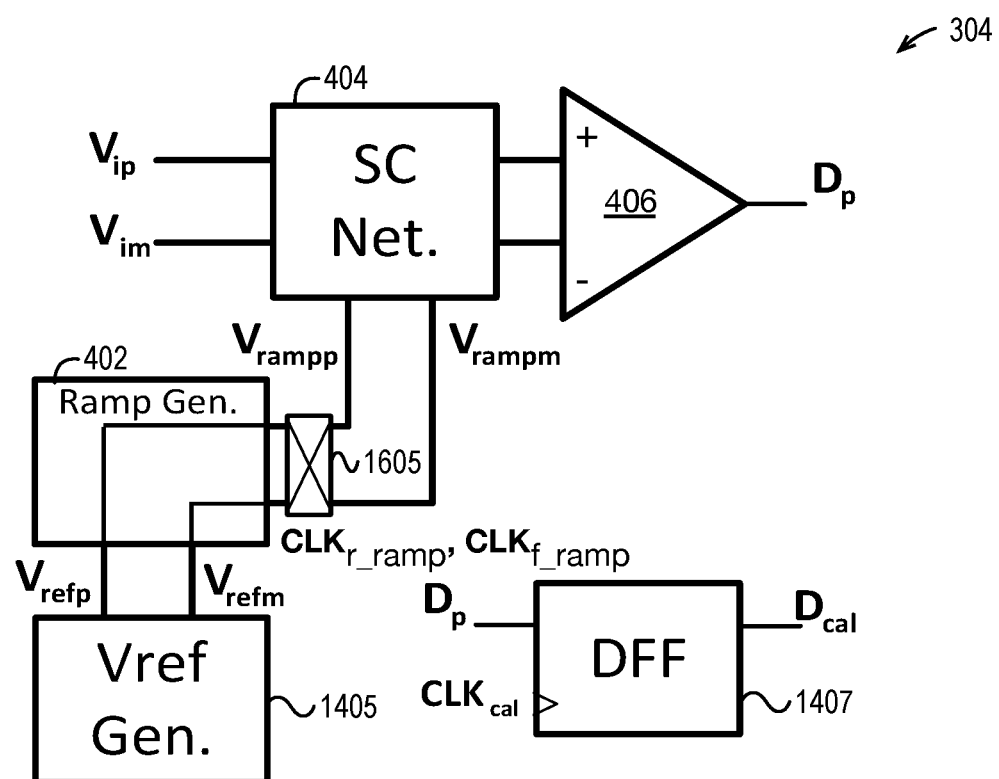
FIG. 16 is a block diagram illustrating an example system for calibrating a gain of the quantizer of FIG. 3.

Referring now to FIG. 16, a block diagram illustrating an improved system for calibrating a gain of a quantizer (e.g., quantizer 304 of FIG. 3) is shown. The system is similar in many respects to the system of FIG. 14. However, the system of FIG. 16 includes a chopping switch 1605 coupled between the output of the ramp generator 402 and the input of the switched capacitor network 404. Additionally, in the system of FIG. 16, the reference voltages $V_{refp}$ and $V_{refm}$ are passed through the ramp generator 402 to the chopping switch 1605 such that during the offset calibration process of quantizer 304, ramp voltages are not generated. That is, the ramp generator 402 is transparent to the reference voltages $V_{refp}$ and $V_{refm}$. The chopping switch 1605 may operate in a pass-through configuration to connect the positive voltage reference $V_{refp}$ to the positive ramp voltage $V_{rampp}$ input of the switched capacitor network 404 and to connect the negative voltage reference $V_{refm}$ to the negative ramp voltage $V_{rampm}$ input. Alternatively, the chopping switch 1605 may operate in a cross configuration to connect the positive voltage reference $V_{refp}$ to the negative ramp voltage $V_{rampm}$ input of the switched capacitor network 404 and to connect the negative voltage reference $V_{refm}$ to the positive ramp voltage $V_{rampp}$ input. The chopping switch 1605 is controlled by a clock signal $CLK_{r\_ramp}$ and $CLK_{f\_ramp}$ according to the normal operation of those signals within the ramp generator 402 as described with respect to FIG. 13. Thus, by operation of the chopping switch 1605, the ramp voltage inputs to the switched capacitor network 404 are a chopped version of the reference voltage $V_{refp}$ and $V_{refm}$.

During calibration, the common mode voltage $V_{cm}$ is connected to the signal inputs. Initially, higher than normal values of the reference voltage $V_{refp}$ and $V_{refm}$ are provided through the ramp generator 402 to the chopping switch 1605 and are scaled down over time until two consecutive values of the comparator 406 output $D_P$ are the same, at which time the comparator 406 offset Vos is measured, as shown in the timing diagram of FIG. 17A.

Figure 17A:
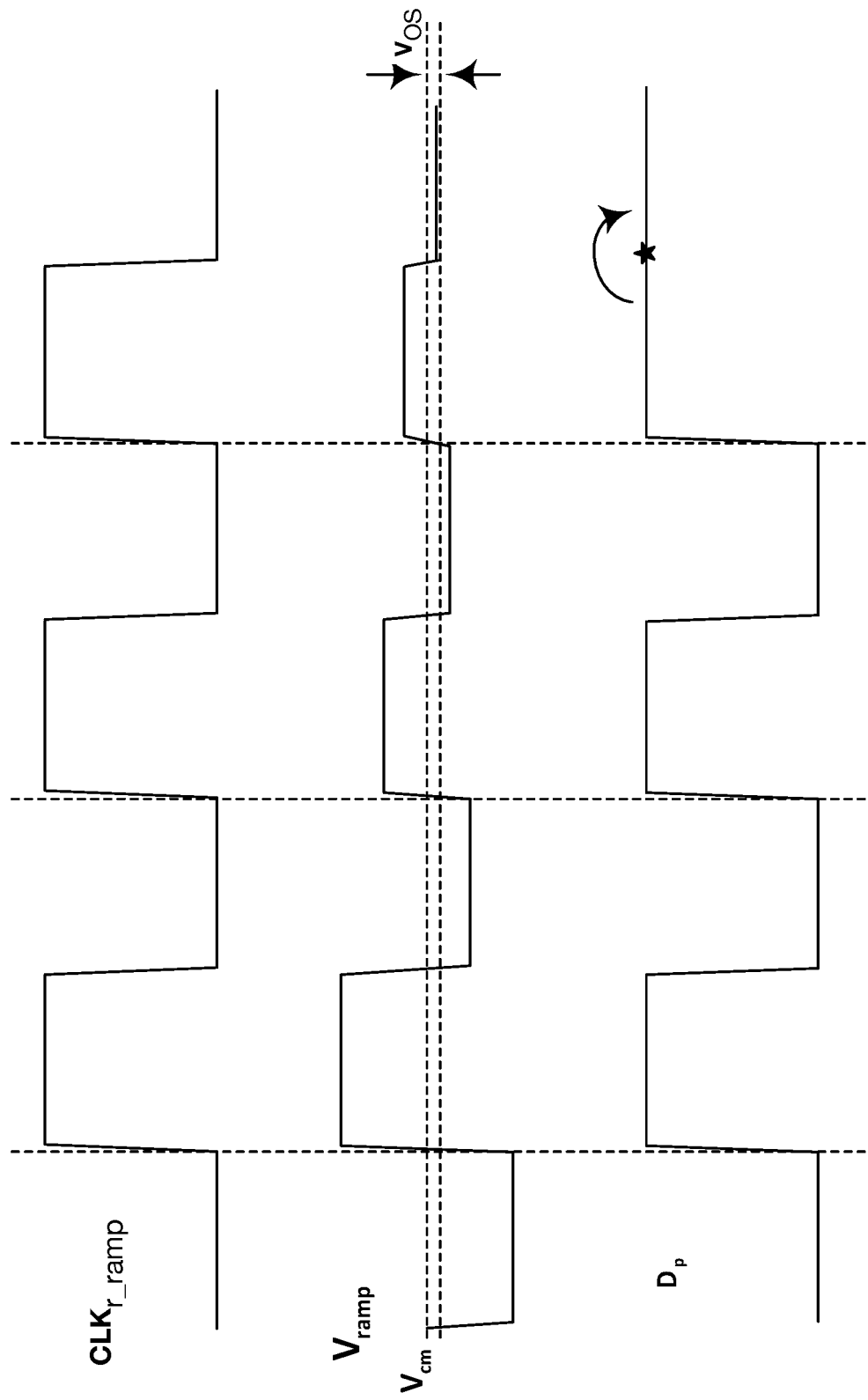
FIGS. 17A through 17C are example timing diagrams illustrating calibration of the gain of the quantizer of FIG. 3.
Figure 17B:
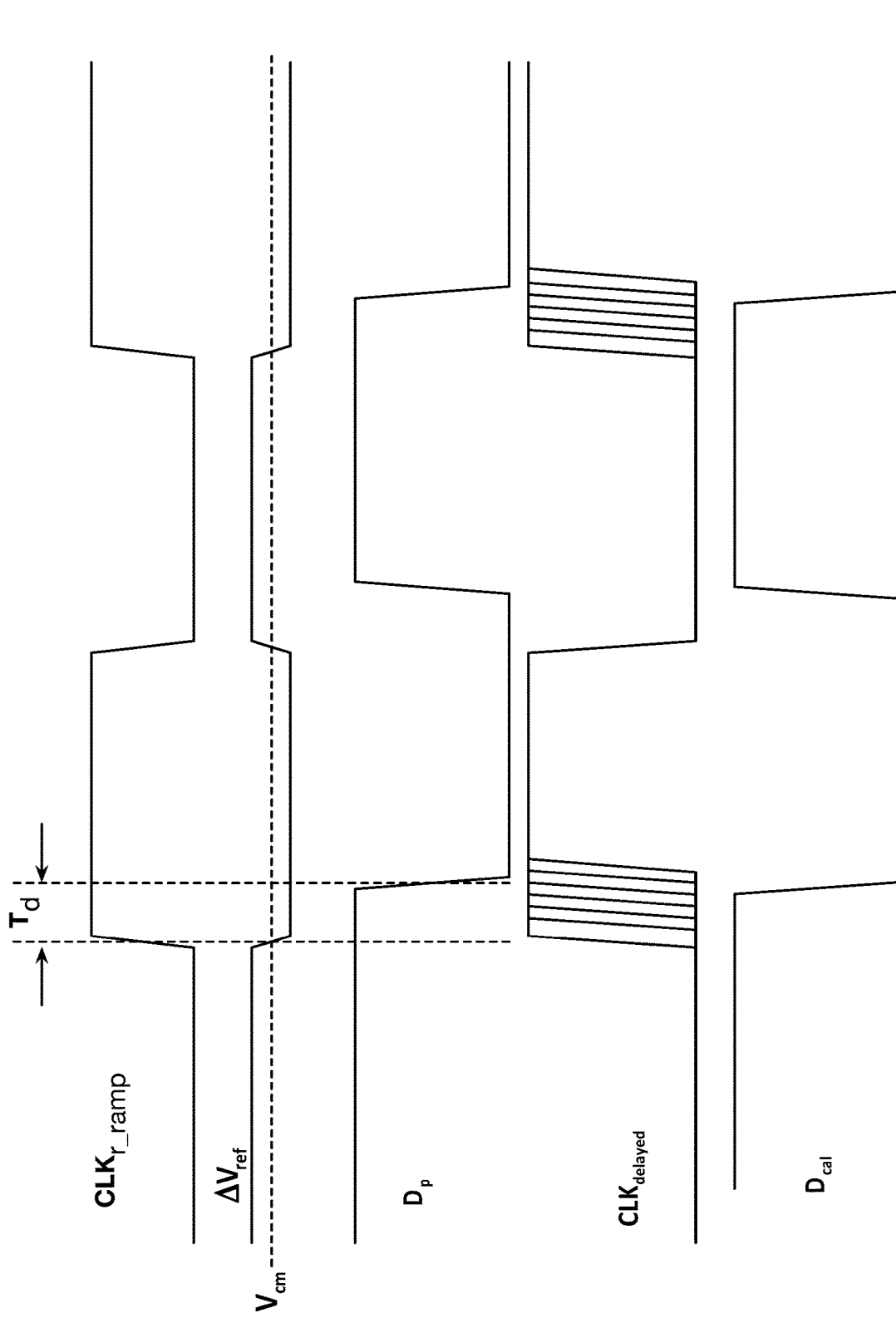

Referring now to FIG. 17B, a timing diagram illustrating measurement of time delay $T_d$ of the comparator 406. The system set up is similar to that of the offset $V_{os}$ measurement. However, the smallest value of the reference voltage $V_{refp}$ and $V_{refm}$ is provided and remains fixed through the measurement process. The output $D_P$ of comparator 406 is skewed from $CLK_{r\_ramp}$ by the comparator 406 delay $T_d$. The calibration clock $CLK_{cal}$, whose rising edge is trimmable, retimes the comparator 406 output $D_P$. The rising edge of the calibration clock $CLK_{cal}$ starts from the rising edge of $CLK_{r\_ramp}$ and gets incremented. When the polarity of $D_{cal}$ flips, the delay $T_d$ is measured, as shown in FIG. 17B.

Figure 17C:
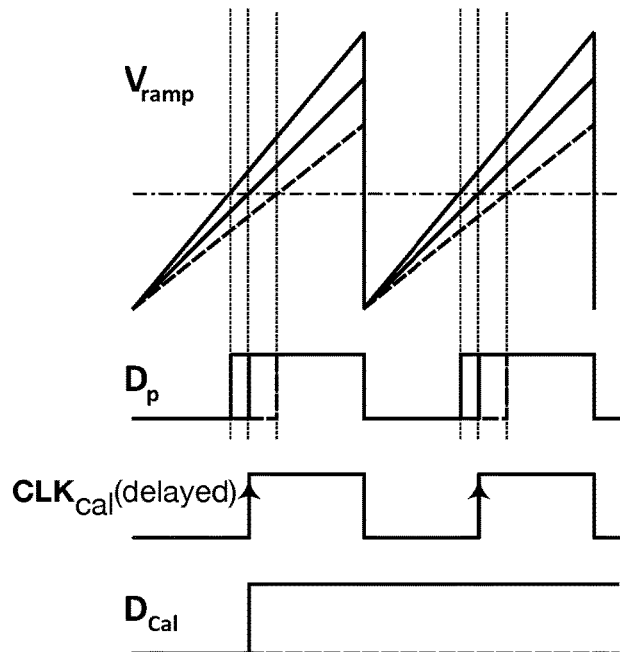

Referring now to FIG. 17C, a timing diagram illustrating calibration of the gain of the quantizer 304 is shown. First, the offset voltage $V_{os}$ of comparator 406 measured according to the process described with respect to FIG. 17A is applied to the reference voltage $V_{refp}$ and $V_{refm}$ to code shift them up or down. Additionally, time delay $T_d$ of the comparator 406 measured according to the process described with respect to FIG. 17B is applied to the calibration clock $CLK_{cal}$ to delay the edge of the calibration clock $CLK_{cal}$ to offset the effect of the comparator 406 delay $T_d$. Then, when the offset $V_{os}$ and delay $T_d$ have been adjusted, the gain error of the quantizer 304 (e.g., the ramp slope) is calibrated.

In addition to the offset and the time delay of the comparator, other non-ideal characteristics of the quantizer 304 that may be separately measured and adjusted may include the RC time constant used by the ramp generator to generate the ramp voltage; a bandgap used in a current source of the quantizer; a resistor, capacitor and/or transistor size ratio that controls a gain of the quantizer; a clock speed of the quantizer; and various circuit parasitic. These other non-ideal characteristics of the quantizer 304 may be measured in addition to, in place of, and/or in combination with the comparator 406 offset $V_{os}$ and time delay $T_d$ and adjusted for while the gain error of the quantizer 304 is calibrated.

Figure 18:
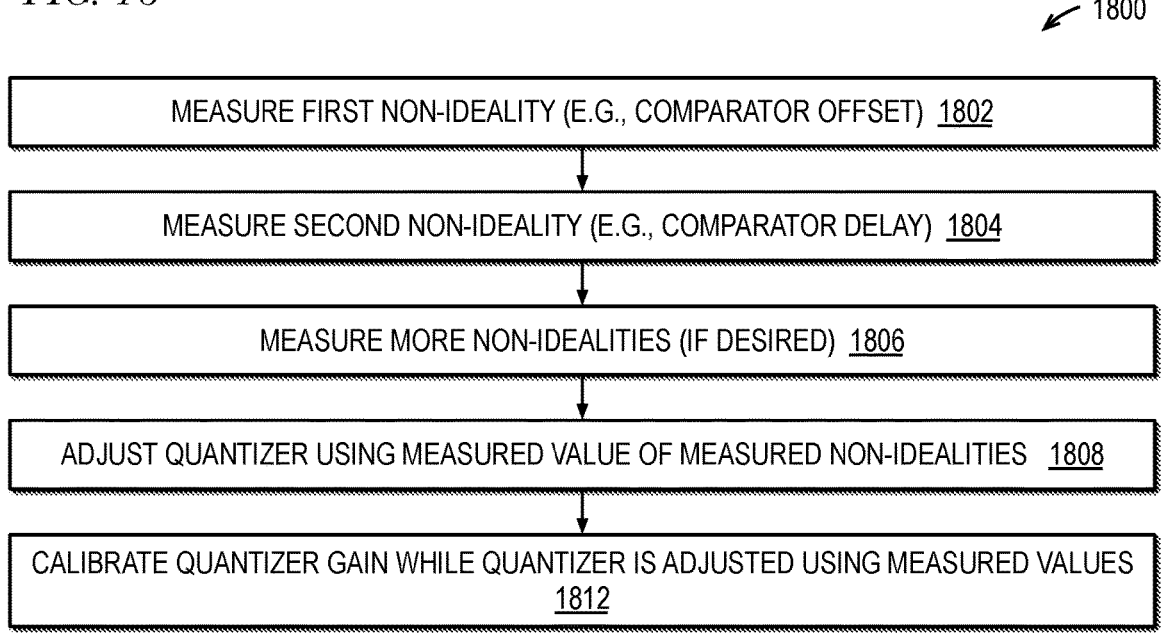
FIG. 18 is a flowchart illustrating an example method for calibrating the quantizer of FIG. 3.

Referring now to FIG. 18, a flowchart illustrating a method for calibrating a quantizer is shown. Operation begins at block 1802.

At block 1802, a first non-ideality is measured (e.g., comparator offset $V_{os}$ per FIG. 17A). The operation proceeds to block 1804.

At block 1804, a second non-ideality is measured (e.g., comparator delay $T_d$ per FIG. 17B). The operation proceeds to block 1806.

At block 1806, additional non-idealities may be measured (e.g., RC time constant, current source bandgap, resistor/capacitor/transistor size ratio clock speed). The operation proceeds to block 1808.

At block 1808, the quantizer 304 is adjusted using the values of the non-idealities measured at blocks 1802 through 1806. The operation proceeds to block 1812.

At block 1812, the gain of the quantizer 304 is calibrated while the quantizer 304 is adjusted using the non-ideality measured values.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. A pulse width modulation (PWM) modulator, comprising:
   a quantizer having a ramp generator and a comparator;
   wherein the quantizer has a gain and at least two measurable non-ideal characteristics that affect the gain;
   wherein the quantizer is adjustable using measured first and second values to correct for respective first and second of the at least two non-ideal characteristics; and
   wherein the gain of the quantizer is calibratable while the quantizer is adjusted using the measured first and second measured values.

2. The PWM modulator of claim 1,
   wherein the at least two non-ideal characteristics are from the set comprising:
   a time delay of the comparator;
   an offset of the comparator;
   a process variation-dependent time constant of a resistor-capacitor (RC) circuit used by the ramp generator to generate a ramp voltage;
   a bandgap of a current source of the quantizer;
   a resistor, capacitor and/or transistor size ratio;
   a clock speed of the quantizer; and
   circuit parasitics.

3. The PWM modulator of claim 1,
   wherein the first of the at least two non-ideal characteristics comprises a time delay of the comparator; and
   wherein the second of the at least two non-ideal characteristics comprises an offset of the comparator.

4. The PWM modulator of claim 1,
   wherein the at least two non-ideal characteristics comprises at least three of the non-ideal characteristics;
   wherein the quantizer is adjustable using the measured first, second and third values to correct for respective the first, second and a third of the at least two non-ideal characteristics; and
   wherein the gain of the quantizer is calibratable while the quantizer is adjusted using the measured first, second and third measured values.

5. The PWM modulator of claim 1,
   wherein the PWM modulator is on a same integrated circuit as a calibration system that measures the first and second values and adjusts the quantizer using the first and second values.

6. A method, comprising:
   in a pulse width modulation (PWM) modulator including a quantizer having a ramp generator and a comparator, the quantizer having a gain and at least two non-ideal characteristics that affect the gain:
   measuring a first value of a first of the at least two non-ideal characteristics;
   measuring a second value of a second of the at least two non-ideal characteristics;
   adjusting the quantizer using the measured first and second values to correct for the first and second of the at least two non-ideal characteristics; and
   calibrating the gain of the quantizer while the quantizer is adjusted using the measured first and second measured values.

7. The method of claim 6,
   wherein the at least two non-ideal characteristics are from the set comprising:
   a time delay of the comparator;
   an offset of the comparator;
   a process variation-dependent time constant of a resistor-capacitor (RC) circuit used by the ramp generator to generate a ramp voltage;
   a bandgap of a current source of the quantizer;
   a resistor, capacitor and/or transistor size ratio;
   a clock speed of the quantizer; and
   circuit parasitics.

8. The method of claim 6,
   wherein the first of the at least two non-ideal characteristics comprises a time delay of the comparator; and
   wherein the second of the at least two non-ideal characteristics comprises an offset of the comparator.

9. The method of claim 6,
   wherein the at least two non-ideal characteristics comprises at least three of the non-ideal characteristics;
   the method further comprising:
   adjusting the quantizer using the measured first, second and third values to correct for the first, second and third of the at least two non-ideal characteristics; and
   calibrating the gain of the quantizer while the quantizer is adjusted using the measured first, second and third measured values.

10. The method of claim 6,
    wherein the PWM modulator and a calibration system that performs said measuring and adjusting are on a same integrated circuit.

* * * * *